(12) United States Patent
Liu et al.

(10) Patent No.: US 6,553,932 B2
(45) Date of Patent: Apr. 29, 2003

(54) REDUCTION OF PLASMA EDGE EFFECT ON PLASMA ENHANCED CVD PROCESSES

(75) Inventors: Kuo-Shih Liu, Milpitas, CA (US); Ramana Veerasingam, Scott Valley, CA (US); Zhi Xu, Albany, CA (US); Ping Xu, Fremont, CA (US); Mario Dave Silvetti, Morgan Hill, CA (US); Gang Chen, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/853,397

(22) Filed: May 11, 2001

(65) Prior Publication Data

US 2001/0042511 A1 Nov. 22, 2001

Related U.S. Application Data

(60) Provisional application No. 60/203,732, filed on May 12, 2000.

(51) Int. Cl.$^7$ ............................. C23C 16/00; H05H 1/00
(52) U.S. Cl. ............................. 118/723 E; 118/723 R
(58) Field of Search ..................... 156/345.47, 345.43; 118/723 E, 723 R; 204/298.34, 298.11, 298.07, 298.33

(56) References Cited

U.S. PATENT DOCUMENTS 5,413,673 A * 5/1995 Fujimoto ............... 156/345.47
5,919,332 A * 7/1999 Koshiishi et al. ......... 118/723 E
6,074,518 A * 6/2000 Imafuku et al. .......... 118/723 E

* cited by examiner

Primary Examiner—Thi Dang
(74) Attorney, Agent, or Firm—Moser, Patterson & Sheridan

(57) ABSTRACT

An appparatus for confining plasma within a process zone of a substrate processing chamber. In one aspect, an apparatus comprises an annular member having an upper mounting surface, an inner confinement wall, and an outer confinement wall. The apparatus is disposed on or otherwise connected to a gas distribution assembly of the processing chamber to prevent plasma edge effects on the surface of a substrate. The apparatus provides a plasma choke aperture that reduces the volume of the process zone around the periphery of the substrate thereby eliminating uneven deposition of material around the edge of the substrate.

58 Claims, 6 Drawing Sheets

REDUCTION OF PLASMA EDGE EFFECT ON PLASMA ENHANCED CVD PROCESSES

This application claims priority to Provisional Application No. 60/203,732, filed on May 12, 2000.

BACKGROUND OF THE INVENTION

1. Field of the Invention

The present invention is related to semiconductor processing equipment. More specifically, the invention relates to an apparatus and processing chamber for confining plasma gas within a processing zone of a processing chamber.

2. Description of the Related Art

In the fabrication of integrated circuits (IC) and other electronic devices, multiple layers of conducting, semiconducting, and dielectric materials are deposited on or removed from a surface of a substrate. Integrated circuit devices comprise horizontal and vertical conductive paths. Horizontal conductive paths or interconnects are typically referred to as lines, whereas vertical conductive paths or interconnects are typically referred to as contacts or vias. Contacts extend to a device on an underlying substrate, while vias extend to an underlying metal layer.

Thin films of conducting, semiconducting, and dielectric materials may be deposited, formed, or removed by a number of deposition techniques. The common deposition techniques in modern processing are physical vapor deposition (PVD), also known as sputtering, chemical vapor deposition (CVD), plasma-enhanced chemical vapor deposition (PECVD), and now electroplating.

In a chemical vapor deposition (CVD) process, a substrate is exposed to a precursor gas which reacts at the surface of the substrate and deposits a product of the reaction on the substrate to grow a film thereon. This surface reaction can be activated in at least two different ways. In a thermal process, the substrate is heated to a sufficiently high temperature to provide the activation energy necessary to cause the precursor gas adjacent to the substrate to react and deposit a layer on the substrate. In a PECVD process, the precursor gas is subjected to a sufficiently high electromagnetic field that excites the precursor gas into energetic states, such as ions and radicals, which react on the substrate surface to form the desired material.

PECVD is one process used in the manufacture of semiconductor devices for depositing silicon carbide (SiC) on various substrates. Silicon carbide is one material useful as a barrier layer, etch stop, and as an anti-reflective coating (ARC), in multiple levels, including the pre-metal dielectric (PMD) level, in IC applications. A PECVD process for depositing SiC involves the introduction of silane gas ($SiH_4$) and methane gas ($CH_4$) into a processing chamber where the gases react and form a film layer of silicon carbide on a substrate positioned in the chamber. Gas distribution assemblies are commonly utilized in PECVD chambers to uniformly distribute gases over the substrate surface upon their introduction into the chamber. Uniform gas distribution is paramount to forming a uniform SiC deposition on the surface of a substrate.

FIG. 1 shows a cross-sectional view of a conventional dielectric deposition chamber 30. The deposition chamber 30 comprises a pedestal 32, chamber walls 34, and a gas distribution assembly or showerhead 40. The showerhead 40 typically presents a planar lower surface which acts as an electrode within the chamber. However, PECVD processes and hardware such as that shown in FIG. 1 have demonstrated problems with deposition uniformity, reproducibility, and reliability in some processes. For example, FIG. 2 shows a typical plasma charge density on a substrate processed using a conventional chamber as shown in FIG. 1. As shown, the plasma charge density is not uniform across the entire surface of the substrate. Moreoever, the plasma density is greater at the edge of the substrate than the center as indicated by the numerical reference 77. Typically, deposition uniformity is thicker or greater at the edge of the substrate compared to the center as a result of the increased plasma density around the perimeter of the electrode. Therefore, there exists a need for a cost effective solution to prevent plasma edge effects on deposition processes, thereby vastly improving deposition uniformity, reproducibility, and reliability.

SUMMARY OF THE INVENTION

The present invention provides an apparatus for confining plasma gas within a processing zone of a substrate processing chamber. In one aspect, an apparatus for confining a plasma within a processing chamber is provided which comprises an upper section having an annular electrode mounting surface, and a lower section integrally formed with the upper mounting section having an inner annular confinement wall and an outer annular confinement wall. The inner annular confinement wall diverges from the vertical at an angle toward the outer annular confinement wall to form a choke aperture. In another aspect, an apparatus is provided comprising an upper section having an annular electrode surface, and a lower section integrally formed with the upper section having an inner confinement wall and an outer confinement wall. In still another aspect, an apparatus for delivering a process gas is provided which comprises a gas distribution assembly having a gas inlet and a gas outlet, and an annular member comprising an upper section having an electrode mounting surface and a lower section integrally formed with the upper section having an inner annular confinement wall and an outer annular confinement wall.

In yet another aspect, a processing chamber is provided for confining a plasma within a processing chamber. The processing chamber comprises a chamber body defining a processing cavity, a substrate support member disposed in the processing cavity, a gas distribution assembly having at least one gas inlet and at least one gas outlet, and an annular member having an upper section comprising an upper section having an electrode mounting surface and a lower section integrally formed with the upper section having an inner annular confinement wall and an outer annular confinement wall.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be conconfinementred limiting of its scope, for the invention may admit to other equally effective embodiments.

DETAILED DESCRIPTION OF THE PREFERRED EMBODIMENT

The present invention generally relates to an electrode extension member that forms a choke aperture in a plasma zone of a substrate processing chamber. The choke aperture reduces the volume of the plasma zone at the edge of the substrate where greater plasma density is typically formed. The extension member extends at least partially into the periphery of the plasma zone, reducing the volume of the plasma around the edge of the substrate. Further, the electrode extension member provides a downwardly extending portion, which better defines the lateral boundaries of the plasma. Consequently, the electrode extension member confines the plasma away from the grounded confinement wall of the processing chamber to prevent losses to the confinement wall. As a result, a more uniform layer deposition is obtained across the entire surface of the substrate.

Many substrate processing chambers are commercially available. For clarity and ease of description however, the following description refers primarily to a processing chamber commercially available from Applied Materials, Inc., of Santa Clara, Calif., known as a CVD D$_x$Z Chamber, and described by Zhao et al. in U.S. Pat. No. 5,558,717, which is incorporated herein by reference.

Figure 3:
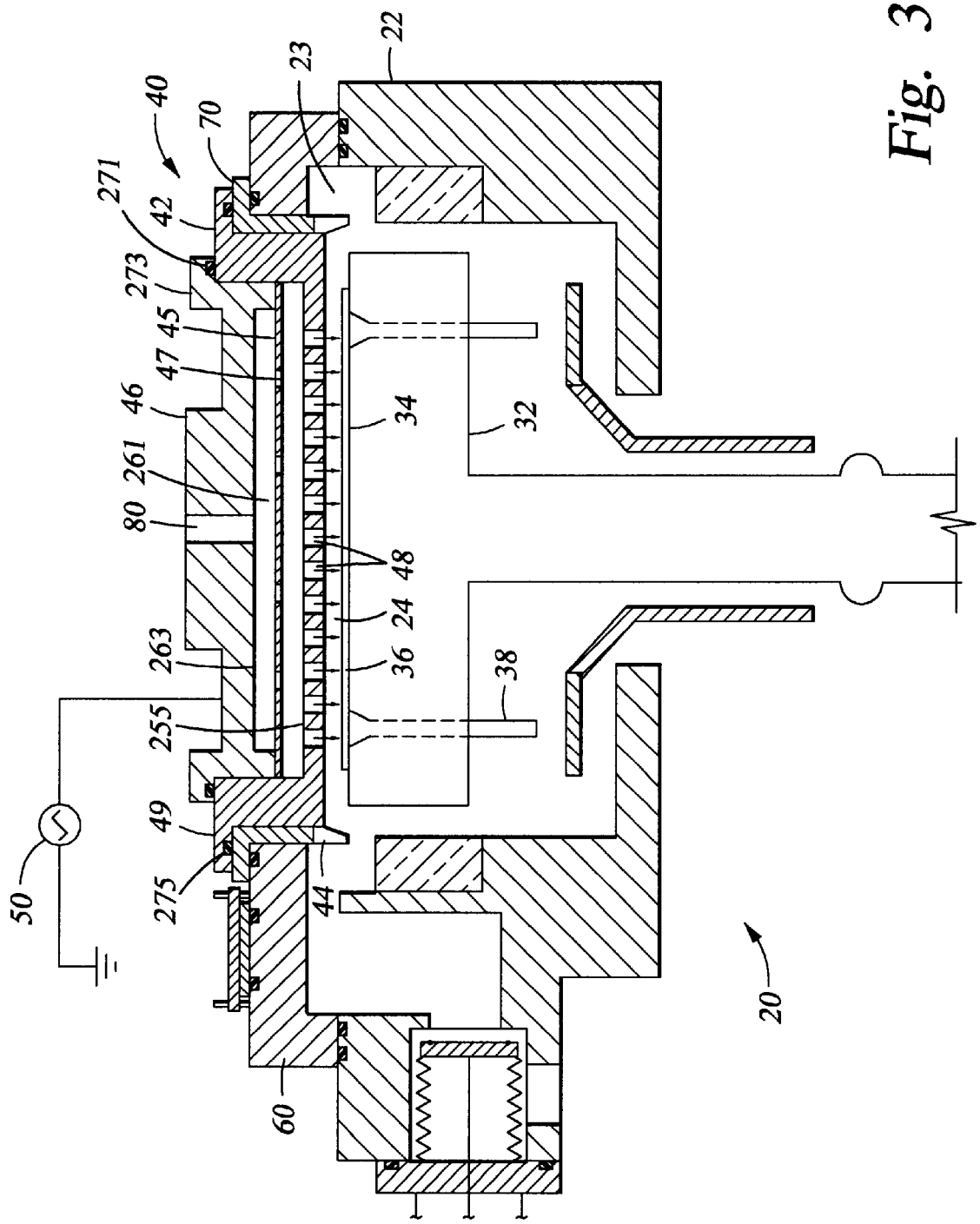
FIG. 3 is a cross-sectional view of a CVD D$_x$Z Chamber commercially available from Applied Materials, Inc., of Santa Clara, Calif., having an electrode extension member.

FIG. 3 is a cross-sectional confinement view of a CVD D$_x$Z Chamber. The CVD D$_x$Z chamber 20 comprises a chamber body 22, typically made of aluminum, which defines an inner vacuum chamber 23 that has a plasma processing region 24. The chamber 20 includes a pedestal 32 having a supporting surface 34 on which a substrate 36 is supported for chemical vapor deposition of a desired material thereon. Vertically movable lift pins 38 facilitate the delivery of the substrate 36 to and from the supporting surface 34. The chamber 20 further includes a gas delivery assembly 40 that introduces process gas and purging gas to the chamber 20, and an RF power supply 50 for creating and sustaining a process gas plasma to effect deposition onto the substrate 36.

The gas delivery assembly 40 is disposed on a base plate 60 at an upper end of the chamber body 22 and includes a gas distribution faceplate 42, often referred to as a showerhead, an electrode extension member 44, a blocker plate 45, and a gas-feed drum 46. The gas is provided to the gas delivery assembly 40 by a central gas inlet 80 formed in the gas-feed drum 46. Although not shown, the process gas inlet 80 is coupled to one or more upstream gas sources and/or other gas delivery components, such as gas mixers. The process gas inlet 80 is in fluid communication with a gap 261 defined by a lower face 263 of the gas-feed drum 46 and an upper surface 255 of the showerhead 42.

The blocker plate 45 is located within the gap 261 and is mounted to the gas-feed cover plate 46. The blocker plate 45 is preferably made of an aluminum alloy and includes passageways or holes 47 formed therein which are adapted to disperse the gases from the gas inlet 80 to the showerhead 42.

The showerhead 42 has a plurality of holes 48 adapted to distribute the gas flow into the process region 24, and an annular flange 49, which is an integral component of the showerhead 40, disposed on an isolation ring 70 to support the gas delivery assembly 40. The showerhead 42 is substantially disc-shaped and is constructed of a material having a high thermal conductivity and low thermal contact resistance (Rc) such as an aluminum alloy with a highly finished surface. Preferably, a seal 275 is disposed in the annular mounting flange 49 to ensure a fluid-tight contact with the isolation ring 70. The isolation ring 70 is comprised of a non-conductive material, such as a ceramic or polymer material, and isolates the RF power from the grounded base plate 60.

The gas-feed drum 46 includes an annular mounting flange 273 formed at a perimeter of the gas-feed drum 46. The annular mounting flange 273 is sized to rest on a perimeter of the showerhead 42. Preferably, a seal 271 is disposed in the annular mounting flange 273 to ensure a fluid-tight contact with the showerhead 40. The gas-feed drum plate 46 is preferably made of aluminum or an aluminum alloy. The gas-feed drum 46 may also include a multi-turn, cooling/heating channel (not shown) containing water or other fluid to maintain the gas delivery assembly 40 at a desired temperature. The gas-feed drum 46 is disposed on the showerhead 42 and in thermal communication therewith. The power source 50 supplies power, which may be direct current (DC) or radio frequency (RF), to the showerhead 42 to facilitate the generation of a plasma.

The electrode extension member 44 is an annular member or a ring-shaped member. In one embodiment, the electrode extension member 44 is disposed on the periphery of the showerhead 40 as shown in FIG. 3. Alternatively, the electrode extension member 44 may be shaped to conform to either or both a surface of a substrate or a lower surface of a gas delivery assembly as described below in the discussion of FIG. 5.

In operation, a film, such as a silicon carbide (SiC) film for example, may be deposited on a substrate 36 that is positioned on the pedestal 32 through cooperation of a robot (not shown) and the lift pins 38. The pedestal 32 raises the substrate 36 into close proximity to the showerhead 42. A process gas comprising, for example, trimethylsilane and a noble gas, such as helium or argon, is then injected into the chamber 20 through the central gas inlet 80 where the gas flows through the holes 47 of the blocker plate 45, and to the back of the showerhead 42. The process gas passes through the holes 48 of the showerhead 42 into the processing region 24 and towards the substrate 36, as indicated by the arrows. Upon reaching the substrate 36, the process gases react on the upper surface thereof. Subsequently, the process gas byproducts flow radially outwardly across the edge of the substrate 36, into a pumping channel 23, and are exhausted from the chamber 20 by a vacuum system (not shown). During the deposition of the SiC film, the chamber pressure is between about 3 to 10 Torr, more preferably about 6 to 10 Torr. A single 13.56 MHz RF power source applies about 300 to 700 watts with a power density of about 4.3 to 10 watts/cm$^2$, more preferably about 400 to 600 watts with a power density of about 5.7 to 8.6 watts/cm$^2$, to the anode and cathode to form the plasma in the chamber with the silicon based gas. The RF power source may be a mixed-frequency RF power supply that typically supplies power at a higher RF frequency of 13.56 MHz and at a lower RF frequency of 360 kHz to enhance decomposition of the reactive species introduced into the chamber. The substrate surface temperature is between about 200° to 400° C., more preferably about 300° to 400° C.

In addition to SiC deposition, it is believed that the deposition hardware described herein may be used with any deposition material such as other dielectric anti-reflective coating (DARC) materials, oxides ($Si_xO_y$), carbon-doped silicon oxide ($Si_xO_y$:C), carbon-doped silicon nitride ($Si_xn_y$:C), or low dielectric materials, for example.

Figure 4:
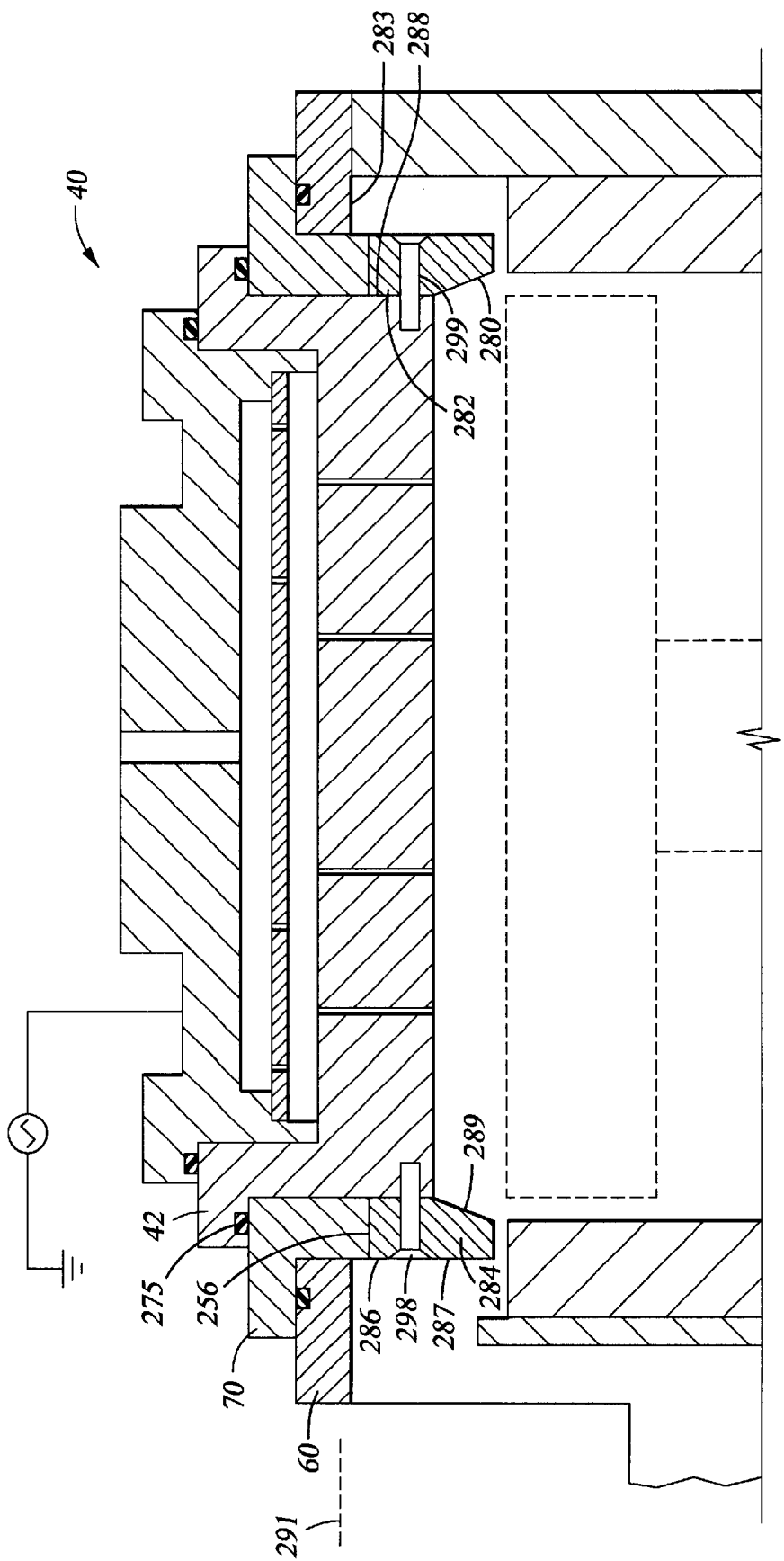
FIG. 4 is an exploded cross-sectional view of the gas delivery assembly shown in FIG. 3.

FIG. 4 is an exploded cross-sectional view of the gas delivery assembly 40 as shown in FIG. 3. The gas delivery assembly 40 includes a showerhead 42 having an electrode extension member 280 disposed on the periphery thereof. The electrode extension member 280 includes an upper section 282 integrally formed with a lower section 284. The upper section 282 has an upper mounting surface 283, an inner wall 288 and an outer wall 286. The lower section 284 comprises an inner confinement wall 289, and an outer confinement wall 287. The diameter of the outer confinement wall 287 is the same or substantially the same as the diameter of the outer wall 286 of the upper section 282. The diameter of the inner confinement wall 289 is the same or substantially the same as the diameter of the inner wall 288 of the upper section 282 and diverges from the vertical toward the dimension of the outer confinement wall 287 of the lower section 282. The inner confinement wall 289 diverges at an angle from about 30 degrees to about 70 degrees. Preferably, the inner confinement wall 289 diverges at an angle of about 45 degrees.

The inner confinement wall 288 of the upper section 282 is coupled to the periphery of the showerhead 42 by fasteners 298, 299, which are preferably bolts, to ensure good electrical communication therewith. The upper section 282 has a substantially planar upper mounting surface 283 that conforms to the lower face 256 of the isolation ring 70. In mating abutment, the upper mounting surface 283 and lower face 256 define an interface that is parallel to the radial axis 291 of the gas delivery assembly 40.

Figure 5:
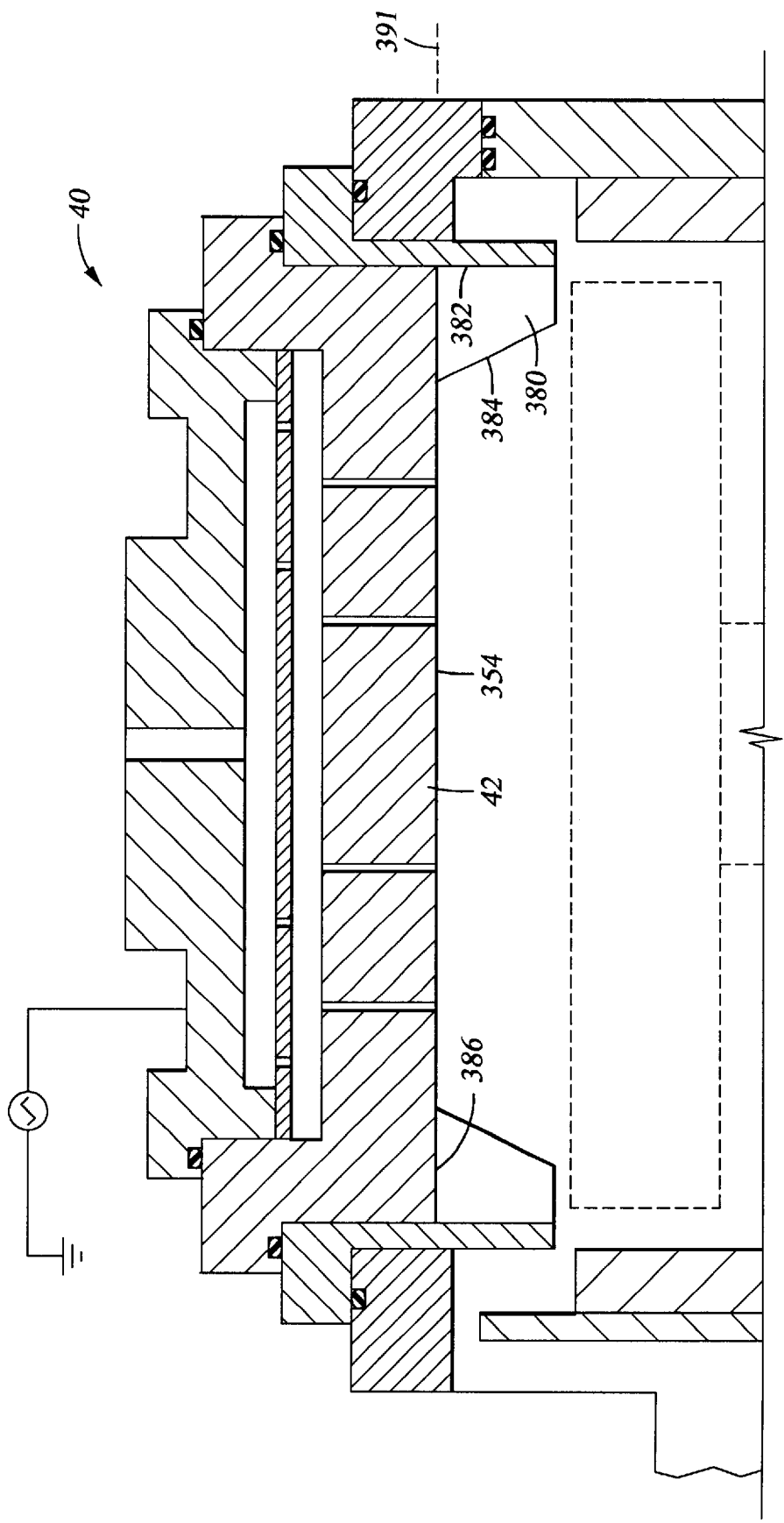
FIG. 5 is a cross-sectional view of a gas delivery system showing an alternative embodiment of an electrode extension member.

FIG. 5 is an exploded cross-sectional view showing an alternative embodiment of an electrode extension member 380. The electrode extension member 380 is preferably used with processing chambers having limited lateral expansion capability. The electrode extension member 380 includes an upper mounting surface 386, an inner confinement wall 384, and an outer confinement wall 382. The diameter of the outer confinement wall 382 is the same or substantially the same as a diameter of a showerhead 42. The diameter of the inner confinement wall 384 is the same or substantially the same as a diameter of a substrate (not shown), and diverges from the vertical toward the outer confinement wall 382. The inner confinement wall 384 diverges toward the outer confinement wall 382 at an angle from about 30 degrees to about 70 degrees. Preferably, the inner confinement wall 384 diverges at an angle of about 45 degrees toward the outer confinement wall 382.

The electrode extension member 380 is disposed on a lower face 354 of the showerhead 42. The substantially planar upper mounting surface 386 of the electrode extension member 380 is coupled to the lower face 354 of the showerhead 42 by bolts or a similar fastener (not shown) to ensure good electrical communication therewith. In mating abutment, the upper mounting surface 386 and the lower face 354 define an interface which is parallel to the radial axis 391 of the gas delivery assembly 349.

The electrode extension members 280 and 380 are constructed of a material having a high thermal conductivity and low thermal contact resistance (Rc) such as an aluminum alloy with a highly finished surface. The electrode extension members 280 and 380 are typically constructed of the same material as the showerhead 42 disposed thereto. Alternatively, in a further embodiment, the showerhead 42 may be milled from a single piece of aluminum or other suitable material to include the downward extension portion of the electrode extension member 280 and 380 as described herein.

The gas delivery assembly 40 as shown in FIGS. 3, 4, and 5 are described as being an annular member or a ring-shaped member. However, the invention is not limited to a particular shape. Other geometric configurations such annular parallelograms and other shapes are contemplated.

The invention will be further described in the following non-limiting example.

EXAMPLE 1

Figure 6:
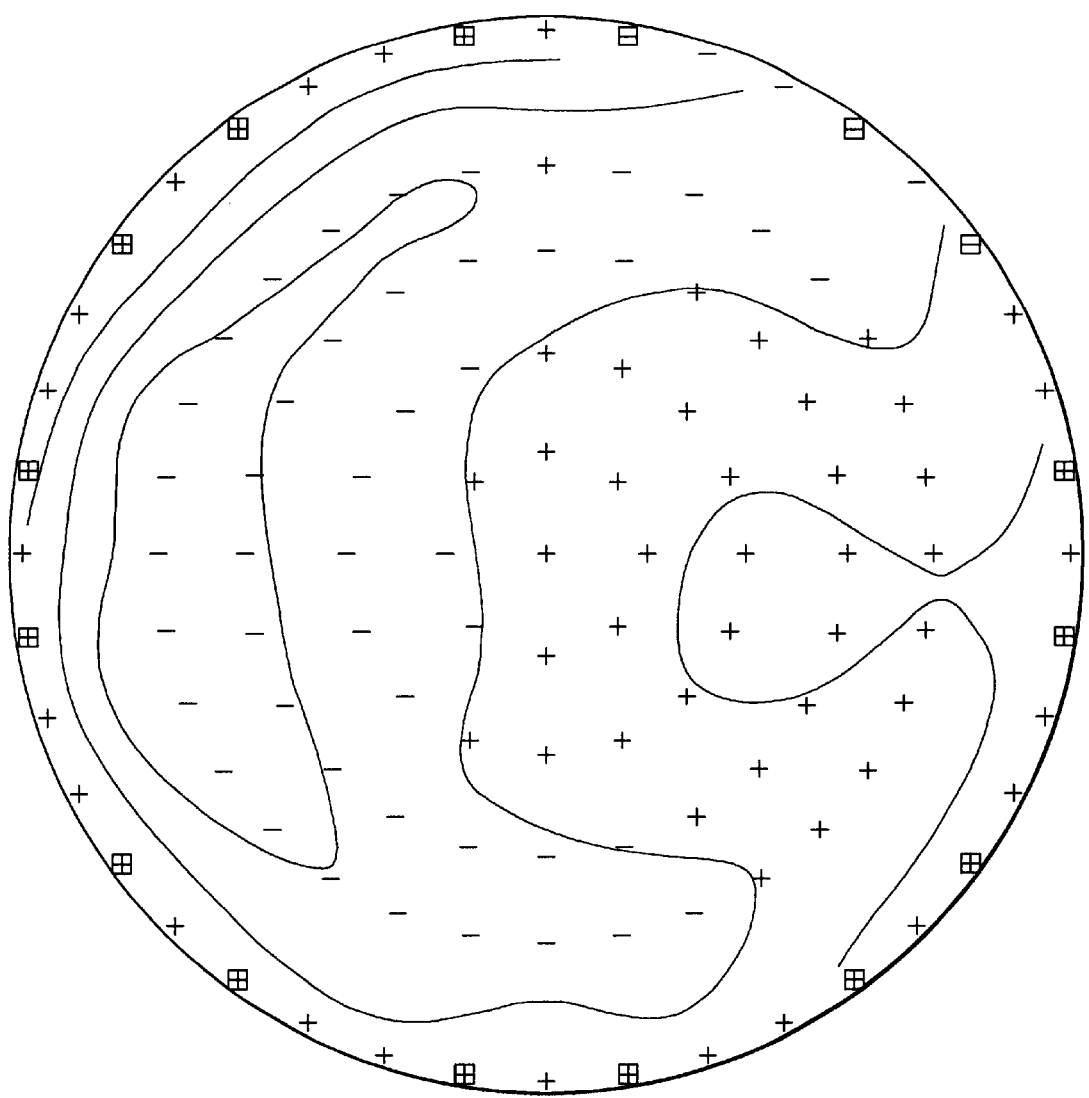
FIG. 6 is a plasma charge density pattern on a substrate using an annular electrode extension apparatus.

A substrate was processed using the processing chamber shown in FIG. 3. A film of silicon carbide having a mean thickness of 923 angstroms was deposited on a silicon substrate. The deposition uniformity was measured by a UV-145SE® Thin Film Measurement System. The deposition thickness had a measured standard deviation of 1.6 percent across the surface of the substrate. As can be seen from FIG. 6, the substrate did not exhibit the doughnut shaped configuration and deposition was uniform across the surface of the substrate.

Comparison Example

Figure 1:
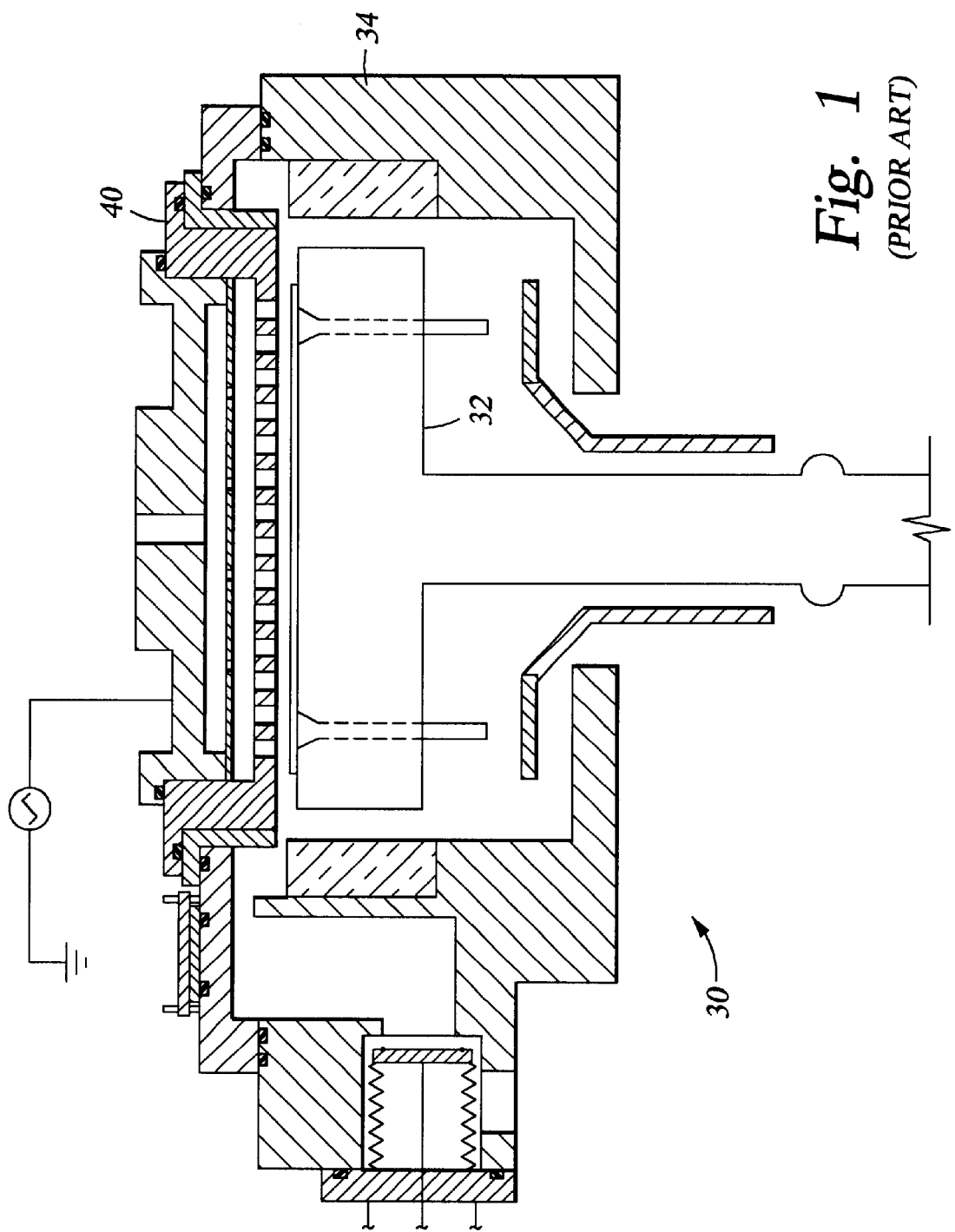
FIG. 1 is a cross-sectional view of a conventional dielectric deposition chamber of the prior art.
Figure 2:
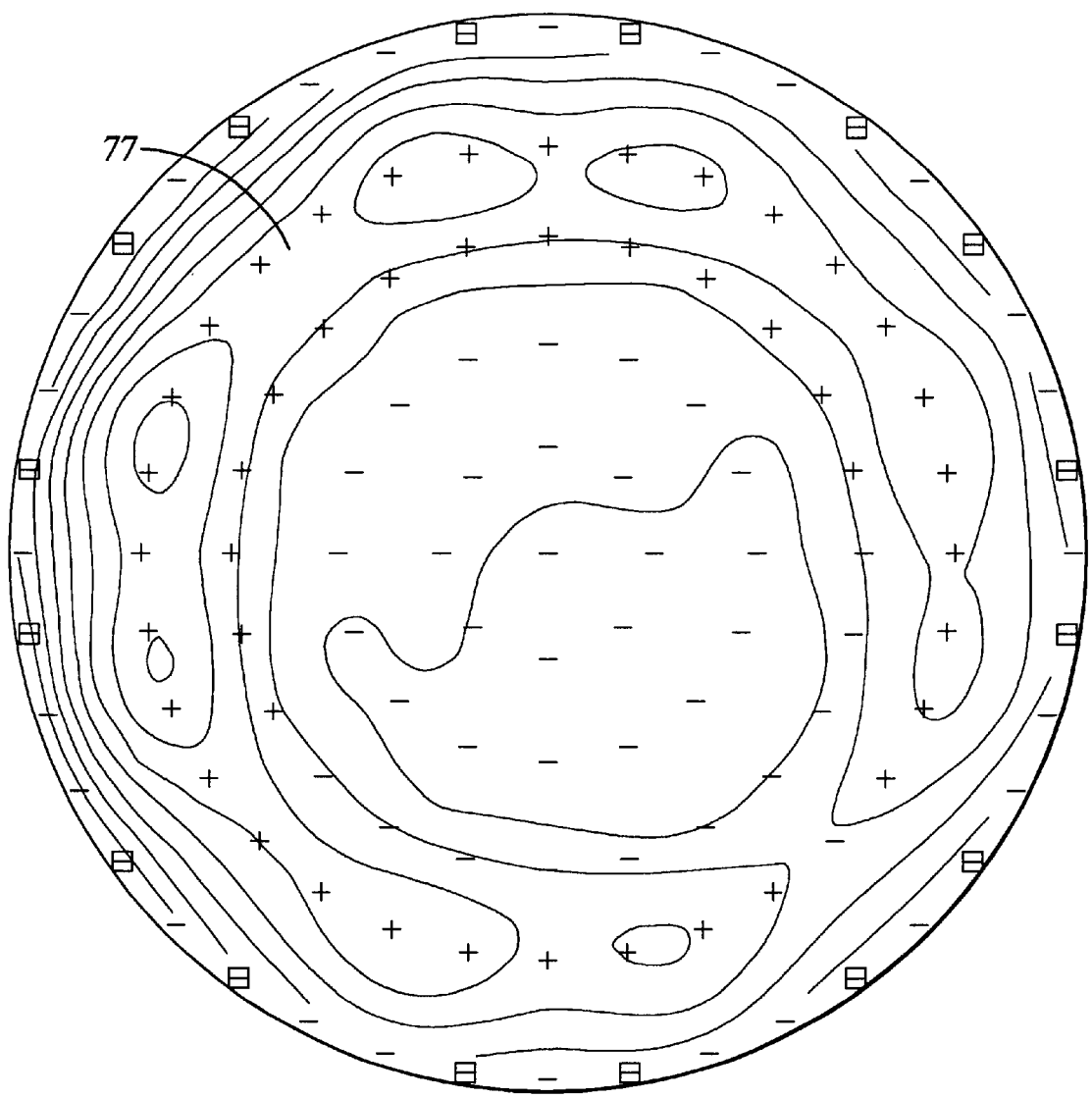
FIG. 2 is a plasma charge density pattern on a substrate processed using a conventional dielectric deposition chamber as shown in FIG. 1.

A deposition process was carried out using a conventional chamber as shown in FIG. 1. A film of silicon carbide having a mean thickness of 977 angstroms was deposited on a silicon substrate. As shown in FIG. 2, the doughnut shaped configuration was present across the surface of the substrate as represented by numerical indication 77. The deposition uniformity was measured by the same UV-145SE® Thin Film Measurement System. The deposition thickness had a measured standard deviation of 3.8 percent.

While foregoing is directed to the preferred embodiment of the present invention, other and further embodiments of the invention may be devised without departing from the basic scope thereof, and the scope thereof is determined by the claims that follow.

What is claimed is:

1. An apparatus for confining a plasma within a processing chamber, comprising:
   an upper section having an annular electrode mounting surface;
   a lower section integrally formed with the upper section having an inner annular confinement wall and an outer annular confinement wall; and
   a showerhead coupled to the upper section, wherein the diameter of the showerhead is substantially the same as the diameter of the outer annular confinement wall.

2. The apparatus of claim 1, wherein the inner annular confinement wall diverges from the vertical at an angle toward the outer annular confinement wall.

3. The apparatus of claim 1, wherein the apparatus comprises an aluminum alloy or comparable metal alloys.

4. The apparatus of claim 1, wherein the inner confinement wall of the lower section diverges from the vertical at an angle from about 30 degrees to about 70 degrees.

5. The apparatus of claim 1, wherein the inner annular confinement wall diverges from the vertical at an angle of about 45 degrees.

6. The apparatus of claim 1, further comprising a showerhead electrode whereby the upper mounting surface is adapted to be positioned adjacent the showerhead electrode to provide good electrical communication therewith.

7. An apparatus for distributing a process gas within a substrate processing chamber, comprising:

an annular member comprising an upper section having an electrode mounting surface and a lower section integrally formed with the upper section having an inner annular confinement wall and an outer annular confinement wall, wherein the inner annular confinement wall diverges from the vertical at an angle toward the outer annular confinement wall; and a gas distribution assembly having a showerhead coupled to the upper section, wherein the diameter of the showerhead is substantially the same as the diameter of the outer annular confinement wall.

8. The apparatus of claim 7, wherein the inner annular confinement wall diverges from the vertical at an angle from about 30 degrees to about 70 degrees.

9. The apparatus of claim 7, wherein the gas distribution assembly further comprises a gas inlet having a gas-feed drum with at least one aperture formed there-through.

10. The apparatus of claim 9, wherein the gas-feed drum is connected to a power supply.

11. The apparatus of claim 9, further comprising a blocker plate having a plurality of apertures formed there-through and disposed on the gas inlet.

12. The apparatus of claim 7, wherein the showerhead comprises a plurality of apertures formed there-through.

13. The apparatus of claim 7, wherein the electrode mounting surface is connected to the showerhead by one or more fasteners.

14. The apparatus of claim 7, wherein the electrode mounting surface is substantially planar and conforms to a lower surface of the showerhead to provide electrical communication therewith.

15. The apparatus of claim 7, wherein the annular member is an integral part of the showerhead.

16. An apparatus for confining a plasma within a processing chamber, comprising:

an annular member having an upper mounting surface, an inner confinement wall, and an outer confinement wall; and a showerhead coupled to the annular member, wherein the diameter of the showerhead is substantially the same as the diameter of the outer confinement wall.

17. The apparatus of claim 16, further comprising showerhead electrode whereby the upper mounting surface is adapted to be positioned adjacent the showerhead electrode to provide good electrical communication therewith.

18. The apparatus of claim 16, wherein the inner confinement wall diverges from the vertical toward the outer confinement wall.

19. The apparatus of claim 16, wherein the inner confinement wall diverges from the vertical at an angle from about 30 degrees to about 70 degrees.

20. The apparatus of claim 16, wherein the inner confinement wall diverges from the vertical at an angle of about 45 degrees.

21. An apparatus for distributing a process gas within a substrate processing chamber, comprising:

an annular member having an upper mounting surface, an inner confinement wall, and an outer confinement wall, wherein the inner confinement wall diverges from the vertical at an angle toward the outer confinement wall; and a gas distribution assembly having a showerhead coupled to the annular member, wherein the diameter of the showerhead is substantially the same as the diameter of the outer confinement wall.

22. The apparatus of claim 21, wherein the inner confinement wall diverges from the vertical at an angle from about 30 degrees to about 70 degrees.

23. The apparatus of claim 21, wherein the gas distribution assembly further comprises a gas inlet having a gas-feed drum with at least one aperture formed there-through.

24. The apparatus of claim 23, wherein the gas-feed drum is connected to a power supply.

25. The apparatus of claim 23, further comprising a blocker plate having a plurality of apertures formed there-through and disposed on the gas inlet.

26. The apparatus of claim 21, wherein the showerhead comprises a plurality of apertures formed there-through.

27. The apparatus of claim 21, wherein the annular member is connected to the showerhead by one or more fasteners.

28. The apparatus of claim 21, wherein the annular member is an integral part of the faceplate.

29. The apparatus of claim 21, wherein the upper mounting surface is coupled to the gas outlet to provide electrical communication therewith.

30. A processing chamber, comprising:

a chamber body defining a processing cavity;

a substrate support member disposed in the processing cavity;

an annular member comprising an upper section having an electrode mounting surface and a lower section integrally formed with the upper section having an inner annular confinement wall and an outer annular confinement wall, wherein the inner confinement wall diverges from the vertical at an angle toward the outer confinement wall; and a gas distribution assembly having a showerhead coupled to the annular member, wherein the diameter of the showerhead is substantially the same as the diameter of the outer annular confinement wall.

31. The processing chamber of claim 30, wherein the inner confinement wall of the lower section diverges from the vertical at an angle from about 30 degrees to about 70 degrees.

32. The processing chamber of claim 30, wherein the electrode mounting surface is adapted to be positioned adjacent the gas distribution assembly to provide good electrical communication therewith.

33. The processing chamber of claim 30, wherein the annular member is connected to the gas delivery system by one or more fasteners.

34. A processing chamber, comprising:

a chamber body defining a processing cavity;

a substrate support member disposed in the processing cavity;

a gas distribution assembly comprising an annular member having an upper mounting surface, an inner confinement wall, and an outer confinement wall, wherein the inner confinement wall diverges from the vertical at an angle toward the outer confinement wall; and an isolation ring coupled to the upper mounting surface so as to define an interface that is parallel to the radial axis of the gas distribution assembly.

35. The processing chamber of claim 34, wherein the inner confinement wall diverges from the vertical at an angle from about 30 degrees to about 70 degrees.

36. The processing chamber of claim 34, wherein the upper mounting surface of the annular member conforms to a lower surface of the gas distribution assembly to provide electrical communication therewith.

37. The processing chamber of claim 34, wherein the annular member is connected to the gas distribution assembly by one or more fasteners.

38. The apparatus of claim 1, further comprising an isolator ring coupled to the at least one of the upper section and the lower section.

39. The apparatus of claim 1, further comprising an isolator ring coupled to the outer annular confinement wall.

40. The apparatus of claim 7, wherein the electrode mounting surface is coupled to a lower surface of the showerhead so as to form an interface that is parallel to a radial axis of the gas distribution assembly.

41. The apparatus of claim 7, further comprising an isolator ring coupled to the annular member.

42. The apparatus of claim 7, further comprising an isolator ring coupled to the outer annular confinement wall.

43. The apparatus of claim 16, further comprising an isolator ring coupled to the annular member.

44. The apparatus of claim 16, further comprising an isolator ring coupled to the outer annular confinement wall.

45. The apparatus of claim 21, wherein the upper mounting surface is coupled to a lower surface of the showerhead so as to form an interface that is parallel to a radial axis of the gas distribution assembly.

46. The apparatus of claim 21, further comprising an isolator ring coupled to the annular member.

47. The apparatus of claim 21, further comprising an isolator ring coupled to the outer confinement wall.

48. The apparatus of claim 30, wherein the electrode mounting surface is coupled to a lower surface of the showerhead so as to form an interface that is parallel to a radial axis of the gas distribution assembly.

49. An apparatus for distributing a process gas within a substrate processing chamber, comprising:
   a gas distribution assembly;
   an annular member coupled to the gas distribution assembly, the annular member having an upper mounting surface, an inner confinement wall, and an outer confinement wall, the inner confinement wall diverging from the vertical at an angle toward the outer confinement wall; and
   an isolator ring coupled to the upper mounting surface so as to define an interface that is parallel to a radial axis of the gas distribution assembly.

50. The apparatus of claim 49, wherein the upper mounting surface is substantially planar and conforms to a lower surface of the isolation ring.

51. The apparatus of claim 49, wherein the upper mounting surface is coupled to a lower surface of the isolation ring.

52. The apparatus of claim 49, wherein the inner confinement wall diverges from the vertical at an angle from about 30 degrees to about 70 degrees.

53. A processing chamber, comprising:
   a chamber body defining a processing cavity;
   a substrate support member disposed in the processing cavity; and
   a gas distribution assembly comprising an annular member having an upper mounting surface, an inner confinement wall, and an outer confinement wall, wherein the inner confinement wall diverges from the vertical at an angle toward the outer confinement wall; and
   an isolator ring coupled to the upper mounting surface so as to define an interface that is parallel to a radial axis of the gas distribution assembly.

54. The apparatus of claim 53, wherein the upper mounting surface is substantially planar and conforms to a lower surface of the isolation ring.

55. The apparatus of claim 53, wherein the upper mounting surface is coupled to a lower surface of the isolation ring.

56. The apparatus of claim 53, wherein the inner confinement wall diverges from the vertical at an angle from about 30 degrees to about 70 degrees.

57. An apparatus for distributing a process gas within a substrate processing chamber, comprising:
   a gas distribution assembly;
   an annular member coupled to the gas distribution assembly, the annular member having an upper mounting surface, an inner confinement wall, and an outer confinement wall, the inner confinement wall diverging from the vertical at an angle toward the outer confinement wall; and
   an isolator ring disposed above the annular member and interposed between the gas distribution assembly and the substrate processing chamber.

58. The apparatus of claim 57, wherein a lower surface of the isolator ring is coupled to the upper mounting surface so as to define an interface that is parallel to a radial axis of the gas distribution assembly.

* * * * *